United States Patent
Oka et al.

(10) Patent No.: US 11,125,785 B2
(45) Date of Patent: Sep. 21, 2021

(54) SENSOR FOR DETECTING TEMPERATURES

(71) Applicant: TDK Corporation, Tokyo (JP)

(72) Inventors: Teiichiro Oka, Tokyo (JP); Hiroyuki Hirano, Tokyo (JP); Mikio Sumiyoshi, Tokyo (JP); Makoto Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 401 days.

(21) Appl. No.: 16/224,937

(22) Filed: Dec. 19, 2018

(65) Prior Publication Data
US 2019/0271601 A1 Sep. 5, 2019

(30) Foreign Application Priority Data

Mar. 1, 2018 (JP) ................. JP2018-36086

(51) Int. Cl.
| | | |
|---|---|---|
| *G01R 19/165* | (2006.01) | |
| *G01K 7/42* | (2006.01) | |
| *G01K 7/16* | (2006.01) | |
| *G05F 1/10* | (2006.01) | |
| *G01K 7/01* | (2006.01) | |

(Continued)

(52) U.S. Cl.
CPC ............ *G01R 19/165* (2013.01); *G01K 7/01* (2013.01); *G01K 7/16* (2013.01); *G01K 7/36* (2013.01); *G01K 7/42* (2013.01); *G01R 15/207* (2013.01); *G01R 19/16566* (2013.01); *G01R 19/32* (2013.01); *G05F 1/10* (2013.01); *H01M 10/486* (2013.01)

(58) Field of Classification Search
CPC ................ G01R 19/165; G01R 15/207; G01R 19/16566; G01R 19/32; G05F 1/10; H01M 10/486; G01K 7/01; G01K 7/16; G01K 7/36; G01K 7/42
See application file for complete search history.

(56) References Cited

U.S. PATENT DOCUMENTS 4,521,727 A * 6/1985 Atherton ................ G01D 3/036
  323/294
7,408,134 B1 * 8/2008 Shaw ........................ G01D 1/18
  219/501

(Continued)

FOREIGN PATENT DOCUMENTS

| JP | 2009-296873 A | 12/2009 |
| JP | 2017-167814 A | 9/2017 |
| JP | 2018-021883 A | 2/2018 |

*Primary Examiner* — Patrick Assouad
*Assistant Examiner* — Demetrius R Pretlow
(74) *Attorney, Agent, or Firm* — Posz Law Group, PLC

(57) ABSTRACT

A sensor is provided with a magnetic detection element that can output an output voltage within a predetermined voltage range according to a magnetic field intensity, an output voltage fixing part that can fix a voltage value of the output voltage to a voltage value outside the voltage range, and a drive voltage output part that can output a drive voltage for driving the output voltage fixing part. The drive voltage fixing part outputs the drive voltage to the output voltage fixing part when the ambient temperature of the drive voltage output part exceeds a predetermined threshold, and when triggered by input of the drive voltage, the output voltage fixing part fixes the voltage value of the output voltage to a voltage value outside the voltage range.

11 Claims, 8 Drawing Sheets

(51) Int. Cl.
*H01M 10/48* (2006.01)
*G01K 7/36* (2006.01)
*G01R 19/32* (2006.01)
*G01R 15/20* (2006.01)

(56) References Cited

U.S. PATENT DOCUMENTS

| | | | | |
|---|---|---|---|---|
| 7,742,273 | B1* | 6/2010 | Shvartsman | H03K 17/0822 361/160 |
| 8,217,628 | B2 | 7/2012 | Yang et al. | |
| 10,088,533 | B2* | 10/2018 | Rivas | G01R 33/07 |
| 2005/0156587 | A1* | 7/2005 | Yakymyshyn | G01R 15/207 324/117 R |
| 2006/0158182 | A1* | 7/2006 | Omagari | G01R 33/02 324/244 |
| 2007/0090825 | A1* | 4/2007 | Shoji | G01R 15/205 324/117 R |
| 2007/0096716 | A1* | 5/2007 | Shoji | G01R 15/205 324/117 H |
| 2009/0039869 | A1* | 2/2009 | Williams | H01L 23/49575 324/123 R |
| 2011/0015881 | A1* | 1/2011 | Chen | G01R 31/42 702/58 |
| 2011/0298446 | A1* | 12/2011 | Shiraki | H01L 29/405 324/126 |
| 2013/0069598 | A1* | 3/2013 | Tanaka | B60L 50/64 320/134 |
| 2013/0179061 | A1* | 7/2013 | Gadh | B60L 53/51 701/123 |
| 2014/0191625 | A1* | 7/2014 | Kitamoto | H02K 11/25 310/68 B |
| 2014/0253102 | A1* | 9/2014 | Wood | G01R 19/0092 324/140 R |
| 2014/0339920 | A1* | 11/2014 | Ingalls, Jr. | H02J 7/0021 307/125 |
| 2014/0354213 | A1* | 12/2014 | Rivera-Poventud | H02J 7/00712 320/107 |
| 2015/0142356 | A1* | 5/2015 | Thomas | G01B 7/10 702/65 |
| 2015/0364976 | A1* | 12/2015 | Takamizawa | G01K 1/026 374/185 |
| 2016/0200245 | A1* | 7/2016 | Rivas | B60Q 3/20 315/77 |
| 2017/0080820 | A1* | 3/2017 | Sun | H02J 7/007 |
| 2017/0102437 | A1* | 4/2017 | Singh | G01R 31/42 |
| 2017/0122988 | A1* | 5/2017 | Kothekar | H02H 3/046 |
| 2018/0156672 | A1* | 6/2018 | Wang | G01K 7/36 |
| 2019/0074145 | A1* | 3/2019 | Delacruz | H02H 3/08 |
| 2019/0120906 | A1* | 4/2019 | Dan | G01R 15/146 |
| 2019/0265302 | A1* | 8/2019 | Wang | G01R 31/3648 |
| 2019/0317136 | A1* | 10/2019 | Roberts | G01R 35/00 |
| 2020/0033384 | A1* | 1/2020 | Kishi | G01R 15/207 |
| 2020/0064382 | A1* | 2/2020 | Takata | G01R 33/022 |
| 2020/0099286 | A1* | 3/2020 | Maeda | H02P 27/06 |
| 2020/0365951 | A1* | 11/2020 | Yamamoto | G01R 31/3842 |
| 2020/0395775 | A1* | 12/2020 | Hayayama | H02J 7/0016 |
| 2021/0006240 | A1* | 1/2021 | Schlafli | H03K 17/0828 |

* cited by examiner

SENSOR FOR DETECTING TEMPERATURES

CROSS REFERENCE TO RELATED APPLICATIONS

The present application is based on Japanese Patent Application No. 2018-36086 filed on Mar. 1, 2018, the disclosure of which is incorporated herein by reference.

TECHNICAL FIELD

The present invention relates to a sensor for detecting abnormal temperatures.

BACKGROUND ART

Conventionally, high-voltage batteries that are, for example, mounted on hybrid electric vehicles (HEVs) and electric vehicles (EVs) are provided with a protection circuit for controlling the charge/discharge of the battery to prevent overcharge and over-discharge to protect the battery. Moreover, to prevent a problem of the protection circuit being damaged by internal heat generation of the battery that is caused by change in the charging properties due to change in the temperature, battery packs that include a battery management unit are known. The battery management unit has a microprocessor for controlling the charging current value of the battery based on the current value that is detected by a current detection element, which is installed on the high current path, and the battery temperature, which is detected using a temperature sensor (a thermistor) that is electrically coupled to the high current path.

PRIOR ART DOCUMENT

Patent Document

Unexamined Japanese Patent Application Publication No. 2009-296873.

SUMMARY OF THE INVENTION

Problem to be Solved by the Invention

By the way, as the above current sensor that is used for controlling the input/output current of the battery of electric vehicles and the like, a current sensor that measures the input/output current that flows through a conductive body such as a bus bar that is connected to the battery using a magnetic detection element such as a Hall IC is known. The bus bar is generally configured with a highly heat-conductive material such as copper and aluminum and used, for example, for electrically connecting the battery and a converter or an inverter or their connection terminal blocks. In such a case, the bus bar is connected to the battery and the inverter or the like by a connecting part such as screws or welding and forms a current path between the battery and the inverter or the like. If the connection between the battery and the inverter or the like becomes incomplete due to defects in the connecting parts or in the connecting process, deterioration of the connecting parts due to prolonged use, rust, dirt, etc., or if the bus bar itself deteriorates, a locally elevated resistance value at the connection point or the bus bar and the inverter themselves may cause abnormal heat generation on the current path and thermally damage the current sensor and/or other parts around the current path.

To avoid damage to the current sensor, for example, a system that is similar to the control system, which can detect the temperature of the bus bar using a temperature-sensitive resistance element such as a thermistor and can control the input/output current that flows through a conductive body such as a bus bar by a desired microprocessor based on the detected temperature, is conceivable. However, in the above system, the thermistor is connected to the high current path independently; therefore, a holding/connection mechanism that is dedicated to the thermistor is necessary. Moreover, in such a case, it is necessary to take into account insulation between the thermistor on the high current path including a high-voltage battery of the order of kV (a so-called electrically strong side) and the microprocessor that is formed with low voltage-resistance circuit elements (a so-called electrically weak side). Therefore, it is necessary to consider using insulating circuit part such as a photocoupler and a peripheral circuit for conveying the voltage change (electric signals) before and after the thermistor (the electrically storing side) to the microprocessor (the electrically weak side). Hence, in the above system, the configuration for detecting abnormal temperatures becomes complicated.

The present invention aims to provide a sensor that can detect abnormal temperatures with a simple configuration.

Problem Solution Means

To solve the above problem, the present invention provides a sensor including a magnetic detection element that can output an output voltage within a predetermined voltage range according to a magnetic field intensity, an output voltage fixing part that can fix a voltage value of the output voltage to a voltage value outside the voltage range, and a drive voltage output part that can output a drive voltage for driving the output voltage fixing part. The drive voltage output part outputs the drive voltage to the output voltage fixing part when the ambient temperature of the drive voltage output part exceeds a predetermined threshold, and when triggered by input of the drive voltage, the output voltage fixing part fixes the voltage value of the output voltage to a voltage value outside the voltage range.

In the above invention, the drive voltage output part includes a fixed resistance element and a heat-sensitive resistance element that are series-connected, and the output voltage fixing part has a first terminal that is electrically connected between the fixed resistance element and the heat-sensitive resistance element of the drive voltage output part, a second terminal that is electrically connected to the output terminal of the magnetic detection element, and a third terminal that is electrically connected to a reference potential. The output voltage fixing part is configured to alternately switch between an on state, in which the second terminal and the third terminal are electrically connected when the drive voltage is applied to the first terminal, and an off state, in which the second terminal and the third terminal are electrically disconnected when the drive voltage is not applied to the first terminal. The voltage value of the output voltage can be fixed to a voltage value outside the voltage range when the off state is switched to the on state. Moreover, it is preferable that the output voltage fixing part includes a semiconductor switch element.

In the above invention, the sensor is a current sensor that detects a current that flows through a conductive body, and the sensor further includes a circuit board on which the magnetic detection element, the output voltage fixing part, and the drive voltage output part are mounted and an enclosure that holds the circuit board. The enclosure is formed with an insertion hole into which the conductive body having an insulating heat-conductive member attached to the outside can be inserted, and the enclosure holds the circuit board such that the drive voltage output part is positioned near the heat-conductive member. In such a case, it is preferable that the enclosure holds the circuit board such that part of the circuit board that is positioned near the part where the drive voltage output part is mounted contacts the heat-conductive member.

In the above invention, the sensor is a current sensor that detects a current that flows through a conductive body, and the sensor further includes a circuit board on which the magnetic detection element, the output voltage fixing part, and the drive voltage output part are mounted and an enclosure that holds the circuit board. The enclosure is formed with an insertion hole into which the conductive body can be inserted. The insertion hole has a hole size such that the conductive body that is inserted in the insertion hole makes contact with the enclosure, the enclosure is configured with an insulating heat-conductive member, and the enclosure can hold the circuit board such that the drive voltage output part is positioned near the insertion hole. In such a case, it is preferable that the enclosure holds the circuit board such that part of the circuit board that is positioned near the part where the drive voltage output part is mounted contacts the inner wall of the enclosure that continues to the side wall of the insertion hole.

In the above invention, the sensor is a current sensor that detects a current that flows through a conductive body, and further provided with a circuit board on which the magnetic detection element, the output voltage fixing part, and the drive voltage output part are mounted and an enclosure that holds the circuit board. The conductive body and the enclosure are fixed and integrated such the conductive body penetrates the enclosure, the enclosure is configured with an insulating heat-conductive member, the enclosure has a cover part that is formed to cover the conductive body that is positioned at the part where the conductive body penetrates the enclosure, and the enclosure holds the circuit board such that the drive voltage output part is positioned near the cover part. In such a case, it is preferable that the enclosure holds the circuit board such that part of the circuit board that is positioned near the part where the drive voltage output part is mounted contacts the cover part.

In the above invention, it is preferable that the heat-conductive member is configured with an insulating resin material, and it is preferable that the heat conductivity of the resin material is 0.1 W/(m·k) or higher.

Efficacy of the Invention

The present invention can provide a sensor that can detect abnormal temperatures with a simple configuration.

MODE FOR IMPLEMENTING THE INVENTION

Figure 1A:
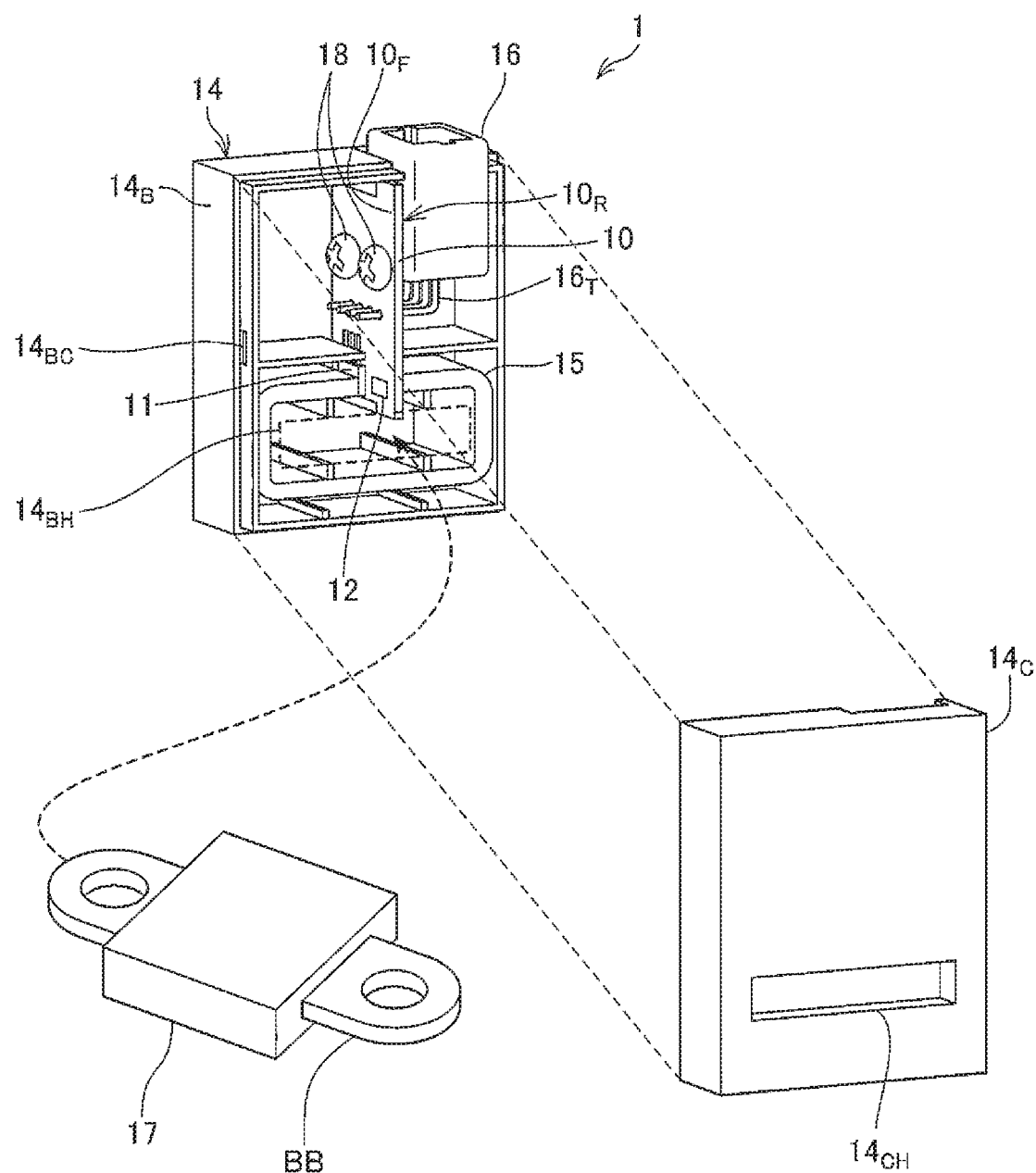
FIG. 1A is a perspective view that shows the schematic configuration of the sensor according to an embodiment of the present invention.

Embodiments of the present invention will be described hereafter with reference to the drawings. Here, the figures are schematic or conceptual, and the measurements of the members and the ratios in measurement between the members are not necessarily consistent with the actual ones. Moreover, the same members may be presented in different sizes or at different ratios depending on the figures. Moreover, in the drawings attached to this specification, for easier understanding, the parts may be changed from the actual ones or exaggerated in size, scale, aspect ratio, or the like.

[General Configuration of the Sensor]

Figure 1B:
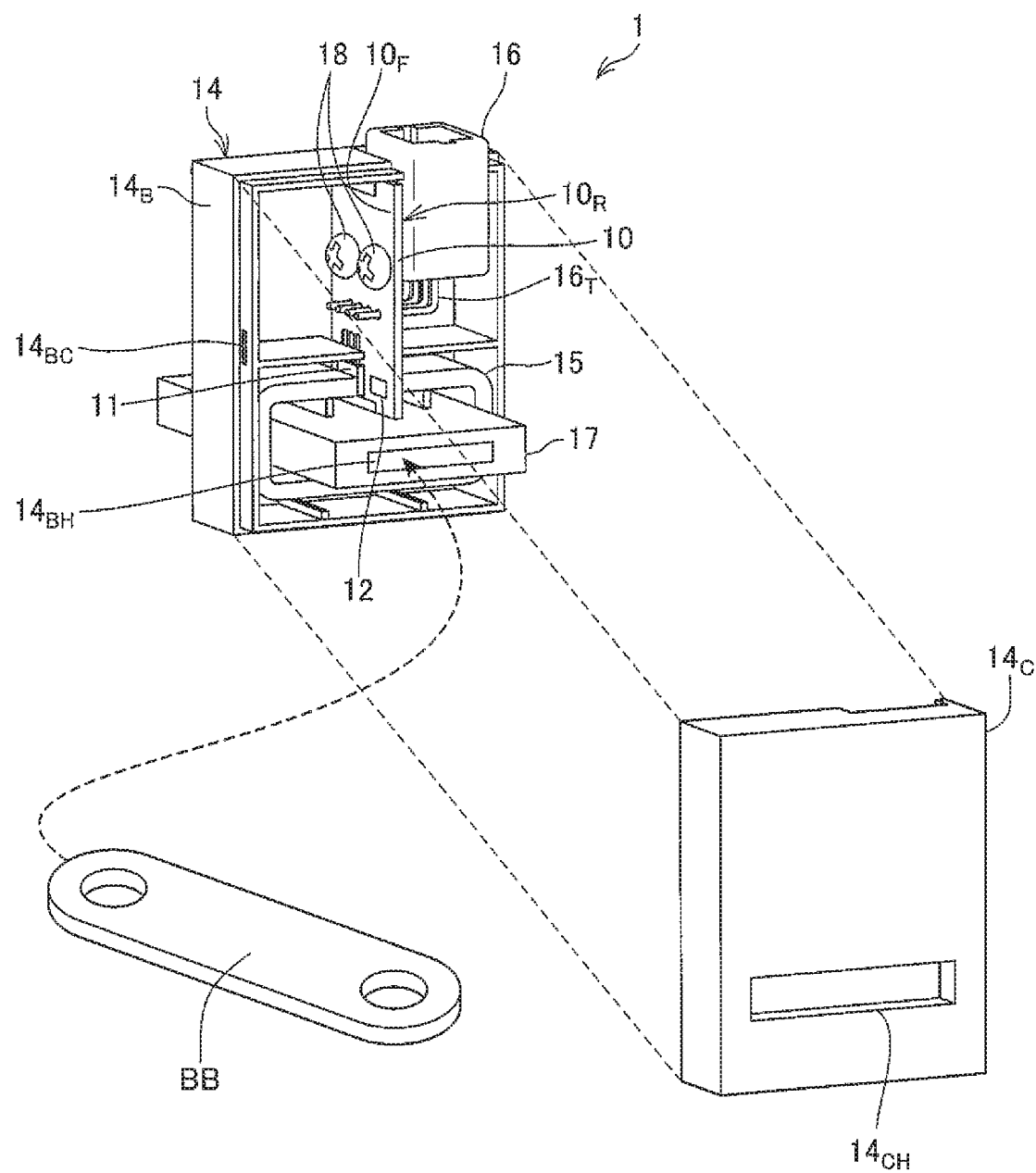
FIG. 1B is a perspective view that shows the schematic configuration of the sensor according to another embodiment of the present invention.
Figure 1C:
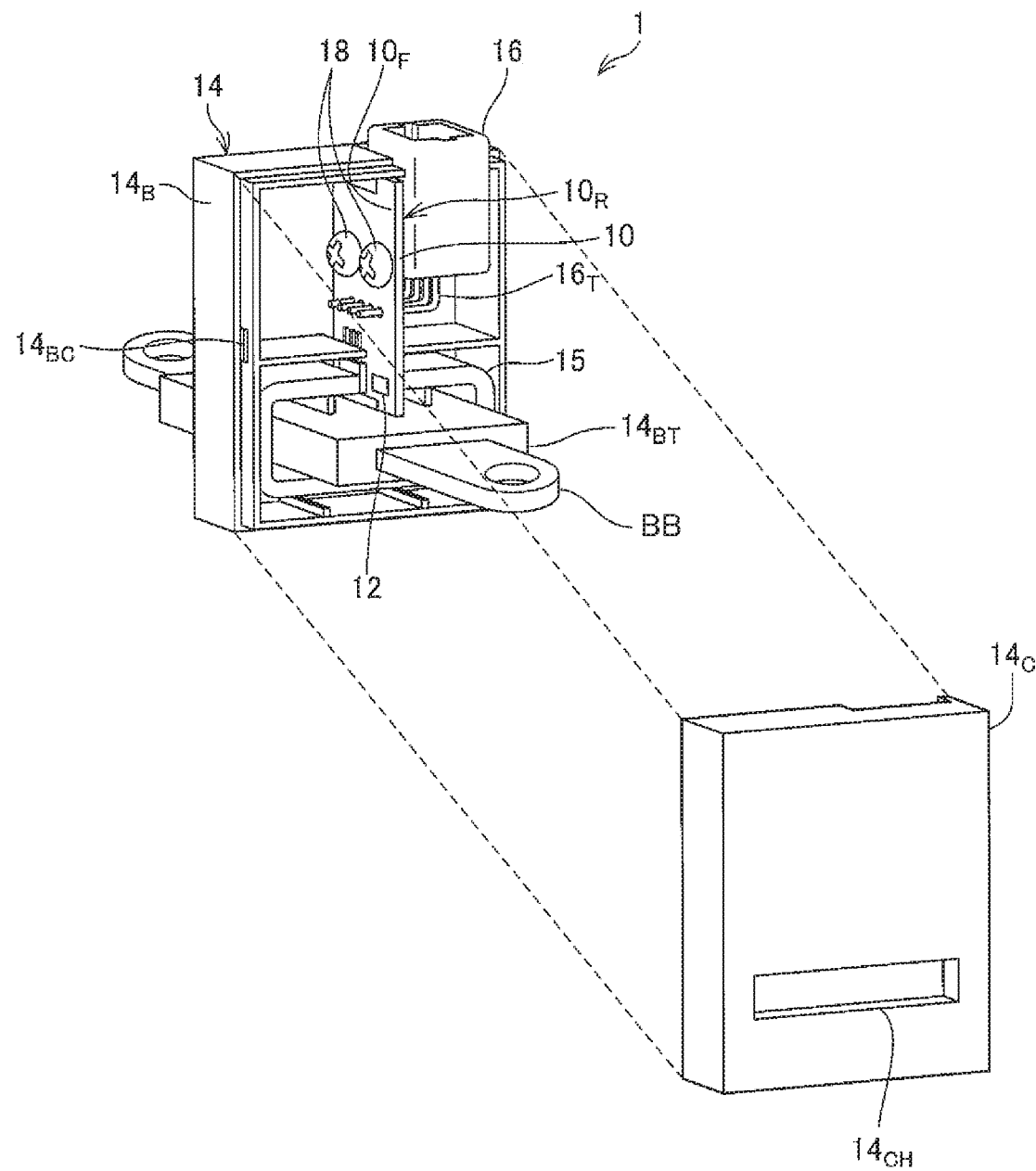
FIG. 1C is a perspective view that shows the schematic configuration of the sensor according to another embodiment of the present invention.

FIG. 1A is a perspective view that shows the schematic configuration of the sensor according to an embodiment of the present invention. FIGS. 1B and 1C are perspective views that show the schematic configuration of the sensor according to other embodiments of the present invention. As shown in FIG. 1A, the sensor according to this embodiment is a current sensor 1 that measures the input/output current that flows through a bus bar BB that is connected, for example, to the battery of a hybrid electric vehicle or the like for controlling the input/output current of the battery. The current sensor 1 includes a circuit board 10 on which a magnetic detection element 11, a drive voltage output part 12, and an output voltage fixing part 13 (not shown in FIG. 1A), which are described later, are mounted, an enclosure 14 that holds the circuit board 10, a nearly C-shaped magnetic body core 15 that has a given space, and a connector 16.

The enclosure 14 has a first enclosure $14_B$ that houses the circuit board 10 and a second enclosure $14_C$ that can cover the opening of the first enclosure $14_B$. In each of the first enclosure $14_B$ and the second enclosure $14_C$, an insertion hole $14_{BH}$ and an insertion hole $14_{CH}$ are formed at positions corresponding to each other. With the opening of the first enclosure $14_B$ covered with the second enclosure $14_C$, a flat plate-shaped bus bar BB is inserted in the insertion hole $14_{BH}$ and the insertion hole $14_{CH}$. The magnetic body core 15 is housed in the first enclosure $14_B$ to surround the insertion hole $14_{BH}$ (see FIG. 1A). Here, the insertion hole $14_{BH}$, the insertion hole $14_{CH}$, and the space within the enclosure 14 (the first enclosure $14_B$ and the second enclosure $14_C$) where the bus bar BB is inserted are inclusively referred to as an insertion hole $14_H$ (see FIG. 3A).

As shown in FIG. 1A, the insertion holes $14_{BH}$ and $14_{CH}$ have a hole shape that corresponds to the width (length in the smaller dimension direction) and thickness of a heat-conductive member 17 that is attached to the exterior of the bus bar BB and through which the entire part (including the bus bar BB) where the heat-conductive member 17 is attached can be inserted. The bus bar BB that the current sensor 1 in this embodiment includes is nearly rectangular in cross-section. However, this is not a limitation, and the bus bar BB may be, for example, nearly circular in cross-section, and the cross-sectional area of the bus bar BB is not particularly limited, either. Here, the hole shapes of the insertion holes $14_{BH}$ and $14_BC$ can be appropriately set according to the shape of the heat-conductive member 17 that is attached to the exterior of the inserted bus bar BB. Moreover, the heat-conductive member 17 can be attached to the exterior of the bus bar BB, for example, via a snap-fit or by welding or bonding. Similarly, the heat-conductive member 17 that is inserted into the insertion hole $14_H$ along with the bus bar BB can also be coupled to the enclosure 14 via the snap-fit or the like.

As shown in FIG. 1B, the heat-conductive member 17 may be formed integrally with the enclosure 14. The heat-conductive member 17 can be formed integrally with the enclosure 14, for example, via a snap-fit, welding or bonding. Moreover, the heat-conductive member 17 may be formed integrally with the enclosure 14, for example, by resin molding such as injection molding. In the sensor 1 shown in FIG. 1B, the insertion hole $14_{BH}$ that has a hole size into which the bus bar BB can be inserted is formed in the heat-conductive member 17, and the bus bar BB can be inserted in the insertion hole $14_{BH}$. The hole size of the insertion hole $14_{BH}$ corresponds to the width (length in the smaller dimension direction) and thickness of the bus bar BB that is inserted in the insertion hole $14_{BH}$. As a result, when the bus bar BB is inserted into the insertion hole $14_{BH}$, the exterior part of the bus bar BB contacts the heat-conductive member 17. Moreover, the insertion hole $14_{CH}$ that is formed in the second enclosure $14_C$ has a hole size allowing insertion of the heat-conductive member 17 along with the bus bar BB when the opening of the first enclosure $14_B$ is covered with the second enclosure $14_C$. Moreover, the heat-conductive member 17 may be configured separately from the enclosure 14. When the heat-conductive member 17 is configured separately from the enclosure 14, the heat-conductive member 17 may be fixed to the portion where the insertion hole $14_{BH}$ is.

As shown in FIG. 1C, the bus bar BB may be formed integrally with the first enclosure $14_B$ by resin molding such as insert molding. In the sensor 1 shown in FIG. 1C, the first enclosure $14_B$ and the bus bar BB are formed integrally in a manner that the bus bar BB penetrates the first enclosure $14_B$. Moreover, the first enclosure $14_B$ has a cover part $14_{BT}$ that is positioned where the bus bar BB penetrates the first enclosure $14_B$ and that partially covers the bus bar BB. The cover part $14_{BT}$ has the same heat conduction effect (which is described later) as the heat-conductive member 17 shown in FIG. 1A and FIG. 1B.

The circuit board 10 has a first face $10_F$ and a second face $10_R$ that faces the first face $10_F$, and the magnetic detection element 11 and the drive voltage output part 12 are arranged on the first face $10_F$. The circuit board 10 is mounted in the first enclosure $14_B$ so that the magnetic detection element 11 arranged on the first surface $10_F$ is positioned in the space of the magnetic body core 15. The connector 16 is provided on the second surface $10_R$ of the circuit board 10 and is fixed to the circuit board 10 by screws 18. The circuit board 10 is held in the enclosure 14 so that the drive voltage output part 12 is positioned near the heat-conductive member 17 (or the cover part $14_{BT}$ shown in FIG. 1C) for the purpose of easily transferring heat generated in the bus bar BB to the drive voltage output part 12. Here, "near" means the relative positional relationship between the drive voltage output part 12 and the heat-conductive member 17 in which the drive voltage output part 12 can properly output a drive voltage that is described later when the ambient temperature of the drive voltage output part 12 reaches a temperature that is equal to or higher than a threshold that is described later due to abnormally generated heat of the bus bar BB.

The magnetic detection element 11 is a magnetic sensor such as a Hall element that can output an output voltage within a predetermined voltage range according to the magnetic field intensity of the magnetic field that is generated due to the input/output current that flows through the bus bar BB. The predetermined voltage range in this embodiment is set to, but not restricted to, a range of 1V to 4V for the power supply voltage when the power supply voltage is, for example, 5V, and can be set as appropriate according to the voltage value of the target output voltage. As the magnetic detection element 11, for example, an integrated Hall element and signal processing IC, such as a Programmable Hall IC, or a hybrid MR element (an AMR element, GMR element, or TMR element) and signal processing IC can be used. Here, it is possible that the magnetic detection element 11 includes a signal processing IC and the signal processing IC has a built-in EEPROM or the like as a storage that stores adjustment parameters for adjusting the properties of the output voltage (output signals).

The drive voltage output part 12 can output a drive voltage for driving the output voltage fixing part 13 and includes a fixed resistance element $12_F$ and a heat-sensitive resistance element $12_V$, which are described later, as circuit elements configuring the drive voltage output part 12. The drive voltage output part 12 outputs a drive voltage to the output voltage fixing part 13 when the ambient temperature of the drive voltage output part 12 exceeds a predetermined threshold. The threshold of the ambient temperature in this embodiment can be appropriately set according to, for example, the distance between the drive voltage output part 12 and the bus bar BB or the like so that the drive voltage output part 12 can properly output a drive voltage. It is preferable that the threshold of the ambient temperature in this embodiment is set within a range of, for example, 100° to 150°. The voltage value of the above drive voltage is not particularly limited as long as it is a voltage value capable of driving the output voltage fixing part 13. However, the voltage value can be appropriately set within a range of, for example, 0.5V to 0.7V. The "ambient temperature" in this embodiment is the temperature at and around the part of the circuit board 10 where the drive voltage output part 12 is mounted and refers to the temperature of heat that is transferred from the bus bar BB to the circuit board 10 and the drive voltage output part 12 via the heat-conductive member 17 (a solid).

The output voltage fixing part 13 is a circuit element that can fix the voltage value of the output voltage that is output from the magnetic detection element 11 to a voltage value outside a predetermined voltage range, and, when triggered by input of a drive voltage that is output from the drive voltage output part 12, fixes the voltage value of the output voltage to a voltage value outside the predetermined voltage range. As a circuit element that configures the output voltage fixing part 13, a semiconductor switch element or the like can be used. In this embodiment, as stated above, the predetermined voltage range is set to 0.5V to 4.5V, and therefore, the voltage value outside the voltage range is a voltage value equal to or higher than 0 and lower than 0.5V or a voltage value exceeding 4.5V and equal to or lower than 5V. The voltage value outside the predetermined voltage range is not limited to the above description, but can be appropriately set according to the set voltage range.

The connector 16 has connection terminals 16$_T$. The connection terminals 16$_T$ and the terminals of the magnetic detection element 11, which are described later, are connected via wiring (not shown) on the circuit board 10. The connector 16 can function as the input part for the power supply voltage that is applied to the magnetic detection element 11 and can function as the output part for the output voltage that is output from the magnetic detection element 11 in the current sensor 1.

[Circuit Configuration of the Sensor]

Figure 2:
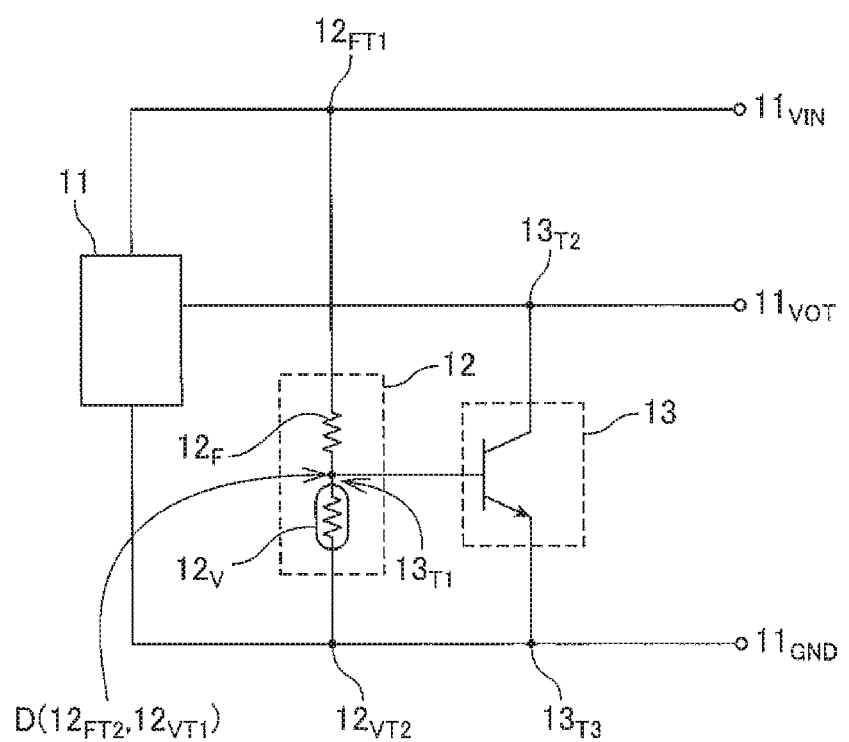
FIG. 2 is a circuit diagram that schematically shows the circuit configuration of the sensor according to an embodiment of the present invention.

FIG. 2 is a circuit diagram that schematically shows the circuit configuration of the sensor 1 in this embodiment. The magnetic detection element 11 has a power supply terminal 11$_{VIN}$, an output terminal 11$_{VOT}$, and a ground terminal 11$_{GND}$. The drive voltage output part 12 includes the series-connected fixed resistance element 12$_F$ and heat-sensitive resistance element 12$_V$. The output voltage fixing part 13 has a first terminal 13$_{T1}$, a second terminal 13$_{T2}$, and a third terminal 13$_{T3}$. One end 12$_{FT1}$ of the fixed resistance element 12$_F$ is electrically connected to the power supply terminal 11$_{VIN}$ of the magnetic detection element 11, the other end 12$_{FT2}$ is connected to one end 12$_{VT1}$ of the heat-sensitive resistance element 12$_V$, and the other end 12$_{VT2}$ of the heat-sensitive resistance element 12$_V$ is electrically connected to the ground terminal 11$_{GND}$. The first terminal 13$_{T1}$ of the output voltage fixing part 13 is connected to the connection point D (the voltage dividing point) between the other end 12$_{FT2}$ of the fixed resistance element 12$_F$ and the one end 12$_{VT1}$ of the heat-sensitive resistance element 12$_V$. The second terminal 13$_{T2}$ is electrically connected to the output terminal 11$_{VOT}$ of the magnetic detection element 11. The third terminal 13$_{T3}$ is electrically connected to the ground terminal 11$_{GND}$.

As the heat-sensitive resistance element 12$_V$ in this embodiment, a PTC (positive temperature coefficient) thermistor of which the resistance value abruptly rises according to rise in the ambient temperature of the heat-sensitive resistance element 12$_V$ (the drive voltage output part 12) can be used. Since the fixed resistance element 12$_F$ and the heat-sensitive resistance element 12$_V$ are series-connected, the drive voltage output part 12 in this embodiment functions as a voltage dividing circuit. As the fixed resistance element 12$_F$, a resistor having a constant that yields a resistance ratio $R_F:R_V$ between the resistance value $R_F$ of the fixed resistance element 12$_F$ and the resistance value $R_V$ of the heat-sensitive resistance element 12$_V$ (the RTC thermistor) when the ambient temperature is lower than the threshold that keeps the voltage value at the connection point D (the voltage dividing point) from reaching the above drive voltage can be selected. For example, in this embodiment, the output voltage fixing part 13 is driven at a drive voltage of 0.5V or higher for the power supply voltage of 5V, a resistor that yields the resistance ratio of 10:1 or higher may be selected as the fixed resistance element 12$_F$.

As the ambient temperature of the heat-sensitive resistance element 12$_V$ exceeds the above threshold due to heat of the bus bar BB, the resistance value of the heat-sensitive resistance element 12$_V$ rises. As a result, the resistance ratio changes, and if the voltage value at the connection point D exceeds the above drive voltage, the output voltage fixing part 13 is driven. In this embodiment, the voltage at the connection point D that has a voltage value within the above voltage range that causes the output voltage fixing part 13 to be driven is referred to as the "drive voltage."

Examples of the PTC thermistor can include, for example, ceramic PTC thermistors of which the main constituents are semiconductor ceramics such as barium titanate. Semiconductor ceramics such as barium titanate are materials that undergo a phase transfer from the tetragonal system to the cubic system when the temperature exceeds a given temperature (the Curie temperature) and therefore have a property that the electric resistance value sharply rises with it. As a constituent of the ceramic PTC thermistor, for example, barium titanate to which a slight amount of additives such as rare-earth elements is added is used. By changing the Curie temperature of the material, a necessary operation temperature can be obtained. Therefore, a PTC thermistor that is configured with a material adjusted to the Curie temperature at which a necessary operation temperature (the ambient temperature that is set as the threshold) can be obtained can be selected as the heat-sensitive resistance element 12$_V$ in this embodiment.

The PTC thermistor is not limited to the ceramic PTC thermistors, but polymer PTC thermistors can also be exemplified. A main constituent of the polymer PTC thermistor is a mixed material of conductive particles such as carbon black and fine nickel particles that are mixed (dispersed) in an organic polymer matrix such as low-density polyethylene. In the polymer PTC thermistor, the current flows smoothly at normal temperatures because of low resistance conductive particles that are in close contact.

However, when the temperature rises with the current increase, the conductive particles are separated from each other and not in contact, so that the current hardly flows, and the polymer PTC thermistor has a high resistance. As a constituent of the polymer PTC thermistor, a mixed material of, for example, fine nickel particles mixed in low-density polyethylene is used, and by changing the mixing ratio, a necessary operation temperature can be obtained. Therefore, as the heat-sensitive resistance element 12$_V$ in this embodiment, a PTC thermistor that is configured with a mixed material of an organic polymer matrix and conductive particles that are mixed based on a specific mixing ratio that can obtain a necessary operation temperature (the ambient temperature that is set as the threshold) can be selected.

The output voltage fixing part 13 is configured to be able to alternately switch between an ON state in which a drive voltage is applied to the first terminal 13$_{T1}$, and the second terminal 13$_{T2}$ and the third terminal 13$_{T3}$ are electrically connected and an OFF state in which a drive voltage is not applied to the first terminal 13$_{T1}$, and the second terminal 13$_{T2}$ and the third terminal 13$_{T3}$ are electrically disconnected. As the output voltage fixing part 13, for example, a semiconductor switch element such as a transistor can be used. In this embodiment, an NPN transistor that is used as the semiconductor switch element configuring the output voltage fixing part 13 is described as an example.

The NPN transistor as the output voltage fixing part 13 has three terminals, a base (B) that corresponds to the first terminal $13_{T1}$, a collector (C) that corresponds to the second terminal $13_{T2}$, and an emitter (E) that corresponds to the third terminal $13_{T3}$. As described above, the first terminal $13_{T1}$ (B) is connected to the connection point D (the voltage dividing point) between the other end $12_{FT2}$ of the fixed resistance element $12_F$ and the one end $12_{VT1}$ of the heat-sensitive resistance element $12_V$.

[Operation of the Sensor]

As the resistance value of the heat-sensitive resistance element $12_V$ rises due to a rise in the temperature, and the above resistance ratio $R_F:R_V$ reaches 10:1 or higher, the voltage value of the voltage at the connection point D (which corresponds to the voltage value of the voltage between the base and the emitter) rises to a predetermined voltage value or higher. The voltage that has this raised voltage value corresponds to the drive voltage. As the drive voltage is applied to the first terminal $13_{T1}$, and the second terminal $13_{T2}$ (C) and the third terminal $13_{T3}$ (E) are electrically connected (the ON state), the potential of the output terminal $11_{VOT}$ becomes equal to the potential of the ground terminal $11_{GND}$ (the reference potential), and as a result, the voltage value of the output voltage is fixed to a voltage value outside the above voltage range. The reference potential can be set within a range from 0 to lower than 0.5V or a range from higher than 4.5V to 5V. The expression "the voltage value of the output voltage is fixed to a voltage value outside the voltage range" in this embodiment means that the voltage value of the output voltage that is output from the magnetic detection element 11 is shifted from a voltage value within the above voltage range to a voltage value outside the above voltage range.

In this embodiment, in the normal state in which the ambient temperature is not higher than the above threshold, the current value of the input/output current that flows through the bus bar BB is measured by an external device, for example an on-board computer or the like, that is connected to the current sensor 1 based on the voltage value of the output voltage that is output from the current sensor 1. On the other hand, in the state in which the ambient temperature is higher than the above threshold, the above external device can determine that abnormal temperatures have occurred based on the output voltage being fixed to a voltage value outside the above voltage range. In other words, according to the current sensor 1 in this embodiment, the output terminal $11_{VOT}$ of the current sensor 1 functions not only as the output terminal of the output voltage in the normal operation but also as the output terminal of a fixed voltage in an abnormal temperature operation, whereby it is possible to detect abnormal temperatures with a simple configuration without specially providing a temperature sensor for measuring the ambient temperature.

In the above drive voltage output part 12, nearly at the same time as or immediately after the ambient temperature exceeds the above threshold and the resistance value of the heat-sensitive resistance element $12_V$ rises, a drive voltage is output to the connection point D to the fixed resistance element $12_F$. Moreover, in the above output voltage fixing part 13, nearly at the same time as or immediately after the above drive voltage is applied to the first terminal $13_{T1}$ (B), the second terminal $13_{T2}$ (C) and the third terminal $13_{T3}$ (E) are electrically connected and the voltage value of the output voltage is fixed to a voltage value outside the above voltage range. Moreover, as described above, the above external device can determine that abnormal temperatures have occurred based on the voltage value of the output voltage being fixed outside the above voltage range.

[Heat-Conductive Member]

Figure 3A:
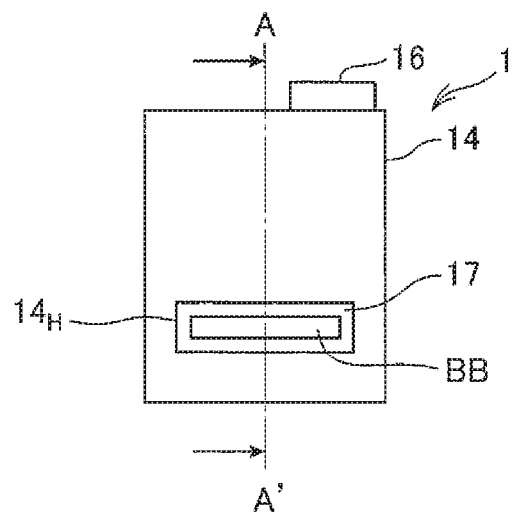
FIG. 3A is a front view that schematically shows the state of the sensor according to an embodiment of the present invention in which the bus bar is inserted in the insertion holes.
Figure 3B:
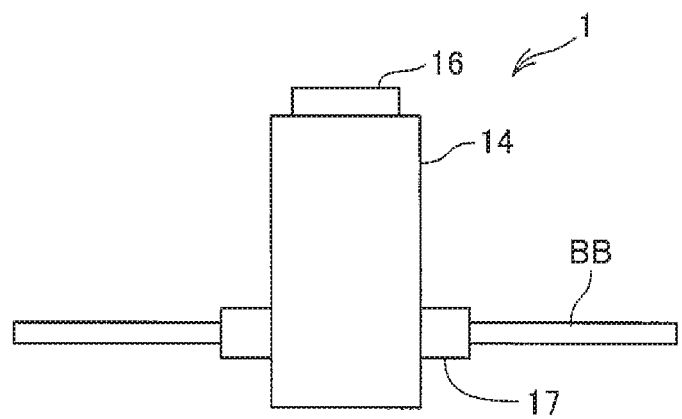
FIG. 3B is a side view that schematically shows the state of the sensor according to an embodiment of the present invention in which the bus bar is inserted in the insertion holes.
Figure 3C:
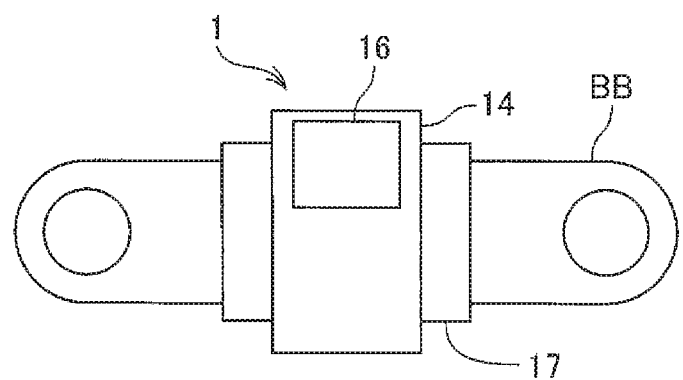
FIG. 3C is a top view that schematically shows the state of the sensor according to an embodiment of the present invention in which the bus bar is inserted in the insertion holes.
Figure 4A:
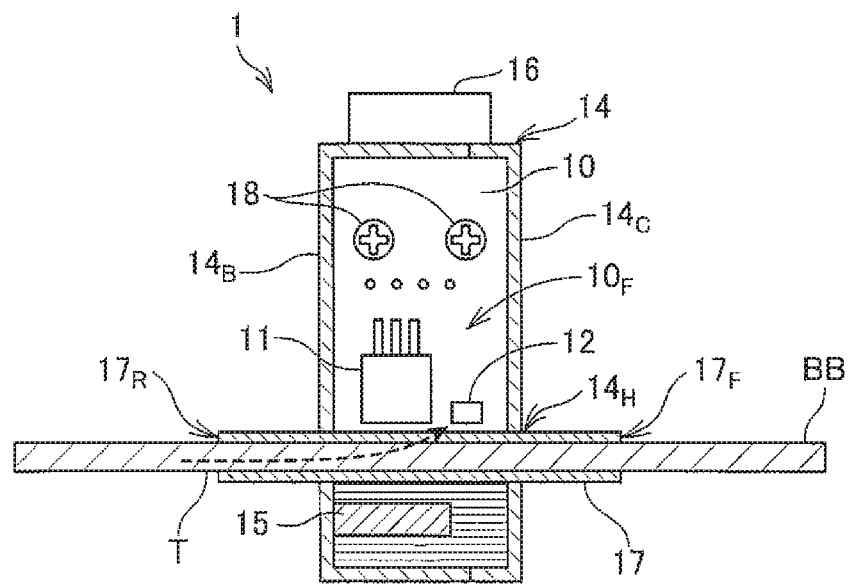
FIG. 4A is a cross-sectional view at A-A' of the sensor that is shown in FIG. 3A.
Figure 4B:
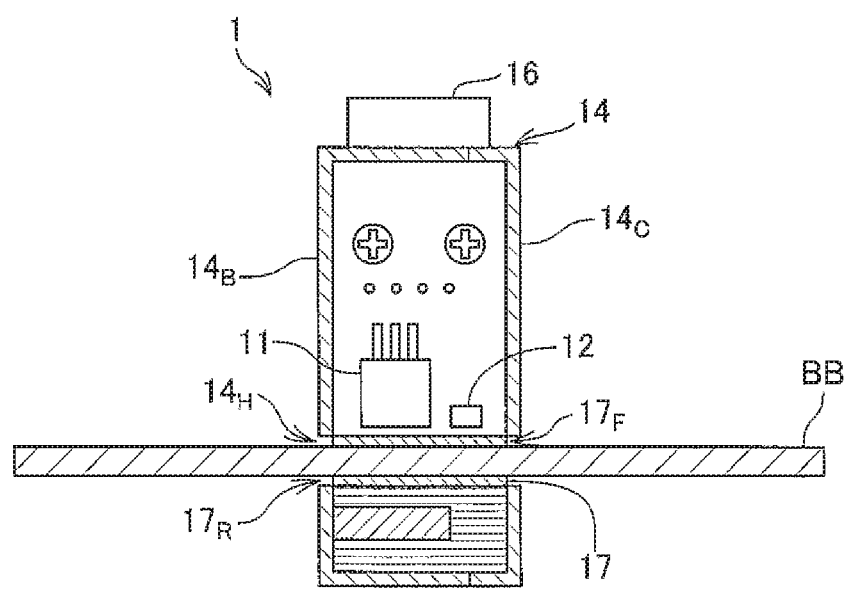
FIG. 4B is a cross-sectional view that schematically shows a state in which the bus bar to which a heat-conductive member according to a modified embodiment of the present embodiment is attached is inserted in the insertion holes of the sensor of this embodiment.
Figure 4C:
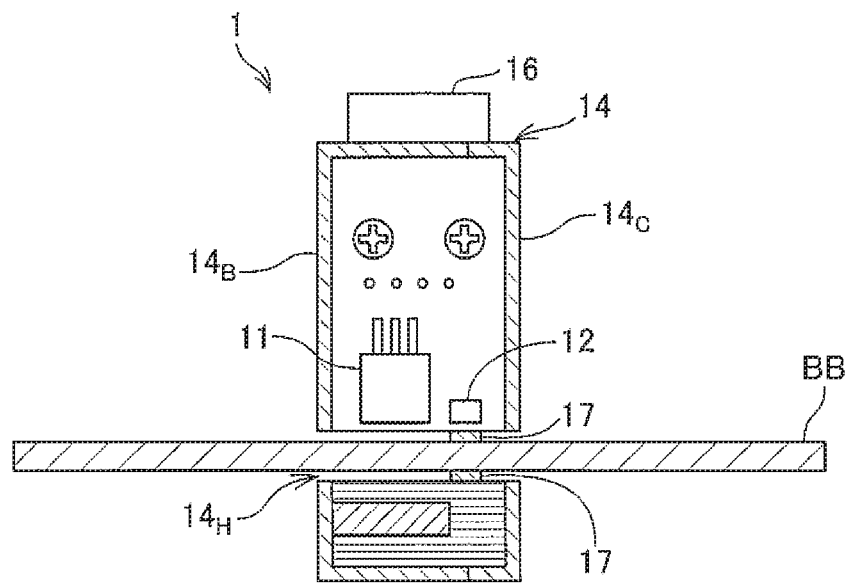
FIG. 4C is a cross-sectional view that schematically shows a state in which the bus bar to which a heat-conductive member according to a modified embodiment of the present embodiment is attached is inserted in the insertion holes of the sensor of this embodiment.
Figure 4D:
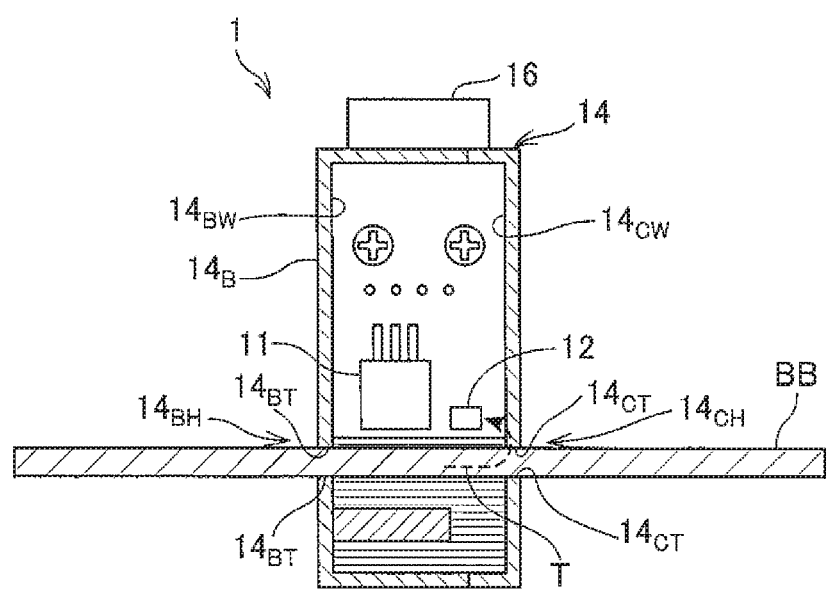
FIG. 4D is a cross-sectional view that schematically shows a state in which the bus bar is inserted in the insertion holes of the modified embodiment of the present embodiment.
Figure 5:
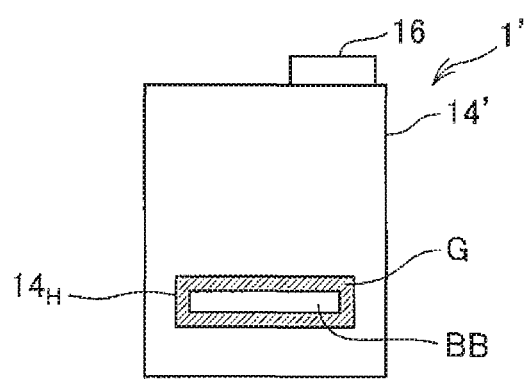
FIG. 5 is a front view that schematically shows the sensor that has such an insertion hole that creates a space between the circumference of the insertion hole and the external wall surface of the bus bar when the bus bar is inserted.

FIG. 3A is a front view that schematically shows the state of the sensor according to an embodiment of the present invention in which the bus bar is inserted in the insertion holes. FIG. 3B is a side view that schematically shows the state of the sensor according to an embodiment of the present invention in which the bus bar is inserted in the insertion holes. FIG. 3C is a top view that schematically shows the state of the sensor according to an embodiment of the present invention in which the bus bar is inserted in the insertion holes. FIG. 4A is a cross-sectional view at A-A' of the sensor that is shown in FIG. 3A. FIGS. 4B and 4C are each a cross-sectional view that schematically shows the state in which the bus bar, to which a heat-conductive member according to a modified embodiment of this embodiment is attached, is inserted in the insertion holes of the sensor of this embodiment. FIG. 4D is a cross-sectional view that schematically shows the state in which the bus bar is inserted in the insertion holes of the sensor according to the modified embodiment of this embodiment. FIG. 5 is a front view that schematically shows the sensor that has such an insertion hole that creates a space (a gap G) between the circumference of the insertion hole and the external wall surface of the bus bar when the bus bar is inserted. Here, to make the difference from the heat-conductive member 17 shown in FIG. 3A easily recognizable, the gap G shown in FIG. 5 is hatched.

As shown in FIG. 5, in a sensor 1' in which a gap G is created between the bus bar BB and the circumference of the insertion hole $14_H$ when the bus bar BB is inserted in the insertion hole $14_H$, air is present in the gap G. Generally, air is relatively low in heat conductivity (for example, 0.0316 W/(m·k) under the condition of 1 atmospheric pressure and 100° C.). Therefore, even if the circuit board 10 is held in an enclosure 14' so that the drive voltage output part 12 is positioned near the bus bar BB, the gap G (air) is present between the bus bar BB and the insertion hole $14_H$ (the top surface of the heat-conductive member 17 and the lower end of the circuit board 10 are separated), whereby heat of the bus bar BB is transferred to the drive voltage output part 12 (the heat-sensitive resistance element $12_V$) slowly, and it takes time to detect abnormal temperatures.

In this embodiment, the insulating heat-conductive member 17 is attached to the exterior of the bus bar BB, and the bus bar BB to which the heat-conductive member 17 is attached in the outside is inserted into the insertion hole $14_H$ (see FIGS. 3A to 3C). As a result, the gap G that is created in the sensor 1' shown in FIG. 5 is filled with the heat-conductive member 17, and heat of the bus bar BB is easily transferred to the drive voltage output part 12 via the heat-conductive member 17. Moreover, in the state in which the bus bar BB to which the heat-conductive member 17 is attached is inserted in the insertion hole $14_H$, it is preferable that the circuit board 10 is held in the enclosure 14 so that at least part of the top surface of the heat-conductive member 17 and the lower end of the circuit board 10 that is positioned near the part where the drive voltage output part 12 is mounted make contact (see FIG. 4A). As a result, it is possible to more easily transfer heat of the bus bar BB to the drive voltage output part 12. As stated above, the circuit board 10 is held in the enclosure 14 so that the drive voltage output part 12 is positioned near the heat-conductive member 17. Therefore, as shown by an arrow T, heat of the bus bar BB is easily transferred to the drive voltage output part 12 via the heat-conductive member 17 and the circuit board 10 (see FIG. 4A).

The heat-conductive member 17 is not particularly limited as long as it has a desired electrical insulating property (for example, a non-conductive body with an electric conductivity of $10^6$ S/m or lower) and is configured with a material with a desired heat conductivity. As materials of the heat-conductive member 17, for example, resin materials such as polyamide, polybutylene terephthalate, polyphenylene sulfide, epoxy or the like; inorganic solid insulating materials such as ceramics and glass; organic fibrous materials such as paper; and rubber or the like can be used. In this embodiment, it is preferable that the heat-conductive member 17 is configured with the resin materials that have an excellent electrical insulating property and a desired heat conductivity, and it is preferable that the heat conductivity of such resin materials is 0.1 W/(m·k) or higher from the viewpoint of making it easy to effectively transfer heat of the bus bar BB to the drive voltage output part 12.

The ends $17_F$ and $17_R$ of the heat-conductive member 17 shown in FIG. 4A protrude outside the enclosure 14 from both ends of the insertion hole $14_H$ along the longitudinal direction of the bus bar BB. The length over which the ends $17_F$ and $17_R$ of the heat-conductive member 17 protrude outside the enclosure 14 from both ends of the insertion hole $14_H$ is not particularly limited as long as they do not interfere with the terminals (the connection parts) that are provided at both ends in the longitudinal direction of the bus bar BB, and can be appropriately set. With the heat-conductive member 17 that has the shape shown in FIG. 4A, the part near the circuit board 10 of the bus bar BB through which high current flows is covered with the heat-conductive member 17, whereby it is possible to ensure that the bus bar BB and the circuit board 10 are electrically insulated.

The shape of the heat-conductive member 17 is not limited to the shape shown in FIG. 4A, and the shapes shown in FIGS. 4B and 4C may be adopted. The ends $17_F$ and $17_R$ of the heat-conductive member 17 shown in FIG. 4B are housed in the enclosure 14 without protruding outside the enclosure 14. Also, with the heat-conductive member 17 shown in FIG. 4B, the part near the circuit board 10 is covered with the heat-conductive member 17, whereby it is possible to electrically insulate the bus bar BB and the circuit board 10.

The heat-conductive member 17 shown in FIG. 4C has a shape such that the heat-conductive member 17 is positioned only near the drive voltage output part 12 (the dimensions (length and width) correspond to the dimensions (length and thickness) of the drive voltage output part 12). As long as heat generated in the bus bar BB can be transferred to the drive voltage output part 12, like the heat-conductive member 17 of the shape shown in FIG. 4C, a shape that is positioned only near the drive voltage output part 12 (a shape relatively smaller in length in the longitudinal direction of the bus bar BB) may be adopted (see FIG. 4C). However, some heat-conductive members 17 in such a case may not sufficiently insulate the bus bar BB and the circuit board 10. Therefore, from the viewpoint of ensuring that the bus bar BB and the circuit board 10 are insulated, it is desirable that at least the part of the bus bar BB that is positioned inside the enclosure 14 is coated with an insulating material such as epoxy resin.

The sensor 1 shown in FIG. 4D is different from the sensors 1 shown in FIGS. 4A to 4C because it does not have a configuration that corresponds to the above-described heat-conductive member 17. In the sensor 1 shown in FIG. 4D, the insertion hole $14_{BH}$ and the insertion hole $14_{CH}$ into which the bus bar BB can be inserted are formed in the first enclosure $14_B$ and the second enclosure $14_C$. The insertion hole $14_{BH}$ and the insertion hole $14_{CH}$ each have a hole size such that the bus bar BB that is inserted into the insertion holes contacts the first enclosure $14_B$ and the second enclosure $14_C$. In other words, the hole size of the insertion hole $14_{BH}$ and the insertion hole $14_{CH}$ corresponds to the width (the length in the smaller dimension direction) and the thickness of the bus bar BB that is inserted into the insertion hole $14_{BH}$ and the insertion hole $14_{CH}$. As a result, when the bus bar BB is inserted into the insertion hole $14_{BH}$ and the insertion hole $14_{CH}$, the exterior part of the bus bar BB contacts the first enclosure $14_B$ and the second enclosure $14_C$. The first enclosure $14_B$ and the second enclosure $14_C$ are configured with an insulating resin material that configures the above-described heat-conductive member 17. The first enclosure $14_B$ and the second enclosure $14_C$ hold the circuit board 10 such that the drive voltage output part 12 is positioned near the insertion hole $14_{CH}$. Furthermore, the inner wall $14_Bw$ of the first enclosure $14_B$ and the inner wall $14_{CW}$ of the second enclosure $14_C$ that continue to the side wall $14_{BT}$ of the insertion hole $14_{BH}$ and the side wall $14_{CT}$ of the insertion hole $14_{CH}$ contact the side edges of the circuit board 10 that are positioned near the part where the drive voltage output part 12 is mounted. Therefore, as shown by an arrow T, heat of the bus bar BB can be transferred to the drive voltage output part 12 via the second enclosure $14_C$ and the circuit board 10 (see FIG. 4D). In other words, in the sensor 1 shown in FIG. 4D, the first enclosure $14_B$ and the second enclosure $14_C$ each have the same heat conduction effect as the above-described heat-conductive member 17.

Moreover, the cover part $14_{BT}$ of the sensor 1 shown in FIG. 1C can also have the same heat conduction effect as the above-described heat-conductive member 17. In other words, the first enclosure $14_B$ and the second enclosure $14_C$ hold the circuit board 10 such that the drive voltage output part 12 is positioned near the cover part $14_{BT}$, and the side edge of the circuit board 10 that is positioned near the part where the drive voltage output part 12 is mounted contacts the cover part $14_{BT}$, whereby heat of the bus bar BB can be transferred to the drive voltage output part 12 via the cover part $14_{BT}$ (the first enclosure $14_B$).

In the sensor 1 in this embodiment, the heat-conductive member 17 or the cover part $14_{BT}$ (a solid) is between the circuit board 10 (the drive voltage output part 12) and the bus bar BB and heat transfer through a solid is utilized, whereby heat of the bus bar BB can quickly be transferred to the drive voltage output part 12. Therefore, according to the sensor 1 in this embodiment, it is possible to quickly detect abnormal temperatures.

The embodiments described above are described for easy understanding of the present invention and not intended to limit the present invention. Hence, the elements that are disclosed in the above embodiment are intended to include any design change or equivalent that belongs to the technical scope of the present invention.

In this embodiment, the current sensor 1 that measures the input/output current that flows through a conductive body such as the bus bar BB using the magnetic detection element 11 is described as an example. However, it is not limited to this. The configuration of the drive voltage output part 12 and the output voltage fixing part 13 in this embodiment can also be applied to, for example, a rotation angle sensor or the like that detects the steering angle of a steering device of a vehicle or the like using the magnetic detection element 11. Moreover, other than the current sensor, various devices, for example, high frequency filters such as a ferrite core and relays, are attached to the bus bar that is connected to high-voltage batteries of electric vehicles or the like. A high frequency filter has no electric connection and a relay requires no output terminal. However, the above-described circuit configuration in this embodiment can be applied to a device near a bus bar such as a high frequency filter or a device such as a relay that is installed on a bus bar. In other words, for a device such as a high frequency filter or a relay, it is possible to detect abnormal temperatures with a simple configuration as in the current sensor 1 in this embodiment.

In this embodiment, the case of using an NPN transistor as the semiconductor switch element that constitutes the output voltage fixing part 13 is described as an example. However, it is not limited to this. For example, a field effect transistor (FET) or the like can be used. Moreover, the output voltage fixing part 13 is not limited to the semiconductor switch element, and a mechanical relay switch can be used. Moreover, the heat-sensitive resistance element $12_V$ that configures the drive voltage output part 12 is not limited to the above-described PTC thermistor. By changing the circuit configuration of the drive voltage output part 12, it is possible to use, for example, an NTC (negative temperature coefficient) thermistor, a CTR (critical temperature resistor) thermistor, or the like.

LEGEND

1 . . . Sensor
10 . . . Circuit board
11 . . . Magnetic detection element
12 . . . Drive voltage output part
$12_F$ . . . Fixed resistance element
$12_V$ . . . Heat-sensitive resistance element
13 . . . Output voltage fixing part
$13_{T1}$ . . . First terminal
$13_{T2}$ . . . Second terminal
$13_{T3}$ . . . Third terminal
14 . . . Enclosure
$14_H$ . . . Insertion hole
$14_{BW}$, $14_{CW}$ . . . Inner wall
$14_{BT}$ . . . Cover part
17 . . . Heat-transfer member

The invention claimed is:

1. A sensor, comprising:
a magnetic detection element that can output an output voltage within a predetermined voltage range according to a magnetic field intensity;
an output voltage fixing part that can fix a voltage value of the output voltage to a voltage value outside the voltage range; and
a drive voltage output part that can output a drive voltage for driving the output voltage fixing part, wherein the drive voltage output part outputs the drive voltage to the output voltage fixing part when the ambient temperature of the drive voltage output part exceeds a predetermined threshold, and when triggered by input of the drive voltage, the output voltage fixing part fixes the voltage value of the output voltage to a voltage value outside the voltage range.

2. The sensor according to claim 1, wherein
the drive voltage output part includes a fixed resistance element and a heat-sensitive resistance element that are series-connected,
the output voltage fixing part has a first terminal that is electrically connected between the fixed resistance element and the heat-sensitive resistance element of the drive voltage output part, a second terminal that is electrically connected to the output terminal of the magnetic detection element, and a third terminal that is electrically connected to a reference potential, and
the output voltage fixing part is configured to alternately switch between an on state, in which the second terminal and the third terminal are electrically connected when the drive voltage is applied to the first terminal, and an off state, in which the second terminal and the third terminal are electrically disconnected when the drive voltage is not applied to the first terminal, and
the voltage value of the output voltage is fixed to a voltage value outside the voltage range when the off state is switched to the on state.

3. The sensor according to claim 1, wherein
the output voltage fixing part includes a semiconductor switch element.

4. The sensor according to claim 1, wherein
the sensor is a current sensor that detects a current that flows through a conductive body, and
the sensor further comprises a circuit board on which the magnetic detection element, the output voltage fixing part, and the drive voltage output part are mounted and an enclosure that holds the circuit board,
the enclosure is formed with an insertion hole into which the conductive body having an insulating heat-conductive member attached to the outside can be inserted, and
the enclosure holds the circuit board such that the drive voltage output part is positioned near the heat-conductive member.

5. The sensor according to claim 4, wherein
the enclosure holds the circuit board such that a part of the circuit board that is positioned near a portion where the drive voltage output part is mounted contacts the heat-conductive member.

6. The sensor according to claim 1, wherein
the sensor is a current sensor that detects a current that flows through a conductive body,
the sensor further comprises a circuit board on which the magnetic detection element, the output voltage fixing part, and the drive voltage output part are mounted and an enclosure that holds the circuit board,
the enclosure is formed with an insertion hole into which the conductive body can be inserted,
the insertion hole has a hole size such that the conductive body that is inserted in the insertion hole makes contact with the enclosure,
the enclosure is configured with an insulating heat-conductive member, and
the enclosure holds the circuit board such that the drive voltage output part is positioned near the insertion hole.

7. The sensor according to claim 6, wherein
the enclosure holds the circuit board such that part of the circuit board that is positioned near a portion where the drive voltage output part is mounted contacts the inner wall of the enclosure that continues to the side wall of the insertion hole.

8. The sensor according to claim 1, wherein
the sensor is a current sensor that detects a current that flows through a conductive body, and
the sensor further comprises a circuit board on which the magnetic detection element, the output voltage fixing part, and the drive voltage output part are mounted and an enclosure that holds the circuit board,
the conductive body and the enclosure are fixed and integrated such that the conductive body penetrates the enclosure, the enclosure is configured with an insulating heat-conductive member, the enclosure has a cover part that is formed to cover the conductive body that is positioned at the part where the conductive body penetrates the enclosure, and the enclosure holds the circuit board such that the drive voltage output part is positioned near the cover part.

9. The sensor according to claim 8, wherein the enclosure holds the circuit board such that part of the circuit board that is positioned near a portion where the drive voltage output part is mounted contacts the cover part.

10. The sensor according to claim 8, wherein the heat-conductive member is configured with an insulating resin material.

11. The sensor according to claim 10, wherein the heat conductivity of the resin material is 0.1 W/(m×k) or higher.

* * * * *